United States Patent
Schade Van Westrum et al.

(10) Patent No.: US 7,323,229 B2
(45) Date of Patent: Jan. 29, 2008

(54) METHOD AND DEVICE FOR COATING A SUBSTRATE

(75) Inventors: Johannes Alphonsus Franciscus Schade Van Westrum, Zevenaar (NL); Gerardus Gleijm, IJmuiden (NL)

(73) Assignee: Corus Technology BV, Ijmuiden (NL)

( * ) Notice: Subject to any disclaimer, the term of this patent is extended or adjusted under 35 U.S.C. 154(b) by 0 days.

(21) Appl. No.: 10/923,505

(22) Filed: Aug. 23, 2004

(65) Prior Publication Data

US 2005/0064110 A1    Mar. 24, 2005

Related U.S. Application Data

(63) Continuation-in-part of application No. PCT/NL03/00139, filed on Feb. 21, 2003.

(30) Foreign Application Priority Data

Feb. 21, 2002  (NL) .................................. 1020059

(51) Int. Cl.
| C23C 14/56 | (2006.01) |
| C23C 14/54 | (2006.01) |
| C23C 14/24 | (2006.01) |
| H05B 6/02  | (2006.01) |
| H05B 6/44  | (2006.01) |
| H05B 6/32  | (2006.01) |
| C23C 14/28 | (2006.01) |
| C23C 14/30 | (2006.01) |

(52) U.S. Cl. ...................... 427/561; 427/564; 427/566; 427/591; 427/593; 427/597; 427/598

(58) Field of Classification Search ...................... None
See application file for complete search history.

(56) References Cited

U.S. PATENT DOCUMENTS 2,664,852 A    1/1954   Chadsey et al.
2,957,064 A   10/1960   Comenetz (Continued)

FOREIGN PATENT DOCUMENTS

EP          0751361         1/1997

(Continued)

OTHER PUBLICATIONS

Derwent abstract of KR 2005061983 A (Jun. 23, 2005)+clip image, J.P. Kim et al., (Derwent accession #2006-452,033).*

(Continued)

*Primary Examiner*—Marianne Padgett
(74) *Attorney, Agent, or Firm*—Stevens, Davis, Miller & Mosher, LLP

(57) ABSTRACT

The invention relates to a method for coating a substrate with a layer of a material, such as a metal, in which a quantity of electrically conductive material is vaporized in a space with a low background pressure and energy is supplied to the material which is to be vaporized in order to vaporize this material. According to the invention, the material which is to be vaporized, while it is being vaporized, is kept floating, without support, in the space and is enclosed in an alternating electromagnetic field, the alternating electromagnetic field being generated with the aid of a high-frequency alternating current. The invention also relates to a device for coating a substrate and to a substrate.

12 Claims, 1 Drawing Sheet

U.S. PATENT DOCUMENTS

| | | | |
|---|---|---|---|
| 3,554,739 | A | 1/1971 | Bickerdike et al. |
| 3,575,133 | A | 4/1971 | Van Audenhovemol et al. |
| 4,385,080 | A | 5/1983 | de Rudnay |
| 5,534,314 | A * | 7/1996 | Wadley et al. ............... 427/585 |
| 5,736,073 | A | 4/1998 | Wadley et al. |
| 5,738,163 | A | 4/1998 | Demukai et al. |
| 5,985,000 | A * | 11/1999 | Shinohara et al. ............ 75/587 |
| 6,294,822 | B1 * | 9/2001 | Nakata ....................... 257/461 |
| 2005/0147765 | A1 * | 7/2005 | Dose et al. ................. 427/460 |

FOREIGN PATENT DOCUMENTS

| | | | |
|---|---|---|---|
| EP | 0751361 | B1 | 8/2001 |
| GB | 1217443 | | 12/1970 |
| JP | 62-1863 | * | 1/1987 |
| JP | 07-252639 | A * | 10/1995 |
| JP | 08104981 | | 4/1996 |
| JP | 11-71605 | * | 3/1999 |
| JP | 11-071605 | A * | 3/1999 |

OTHER PUBLICATIONS

Derwent abstract, Acc-No. 2006-316316; Derwent-week: 200734; Baptiste et al., Corus technology BV; "Apparatus for Levitation of Conductive Material for Physical Paper Deposition, comprises . . . ", classification C23C14/26.*

Yildiz Bayazitoglu et al., The 3$^{rd}$ International Symposium on Electromagnetic Processing of Materials, Nagoya, Japan, ISIJ, "Thermal Electromagnetic Levitation", pp. 345-351, 2000, no month.

J. Priede, The 3$^{rd}$ International Symposium on Electromagnetic Processing of Materials, Nagoya, Japan, ISIJ, "Instabilities of Electromagnetically Levitated Bodies and Their Prevention", pp. 352-357, 2000, no month.

Arimichi Morita et al., The 3$^{rd}$ International Symposium on Electromagnetic Processing of Materials, Nagoya, Japan, ISIJ, "Alloying titanium with tantalum which has high melting point and great difference in specific gravity, with Cold Crucible Levitation Melting (CCLM)", pp. 358-363, 2000, no month.

Yoshinao Kobayashi et al., The 3$^{rd}$ International Symposium on Electromagnetic Processing of Materials, Nagoya, Japan, ISIJ, "Reaction Between Molten Metal and Flux in a Cold Crucible (Dephosphorization of Molten Stainless Steel by a Reducing Reaction)", pp. 364-369, 2000, no month.

D. Batic et al., The 3$^{rd}$ International Symposium on Electromagnetic Processing of Materials, Nagoya, Japan, ISIJ, "Optimized Magnetic Levitation with Minimum Power Dissipation", pp. 370-375, 2000, no month.

* cited by examiner

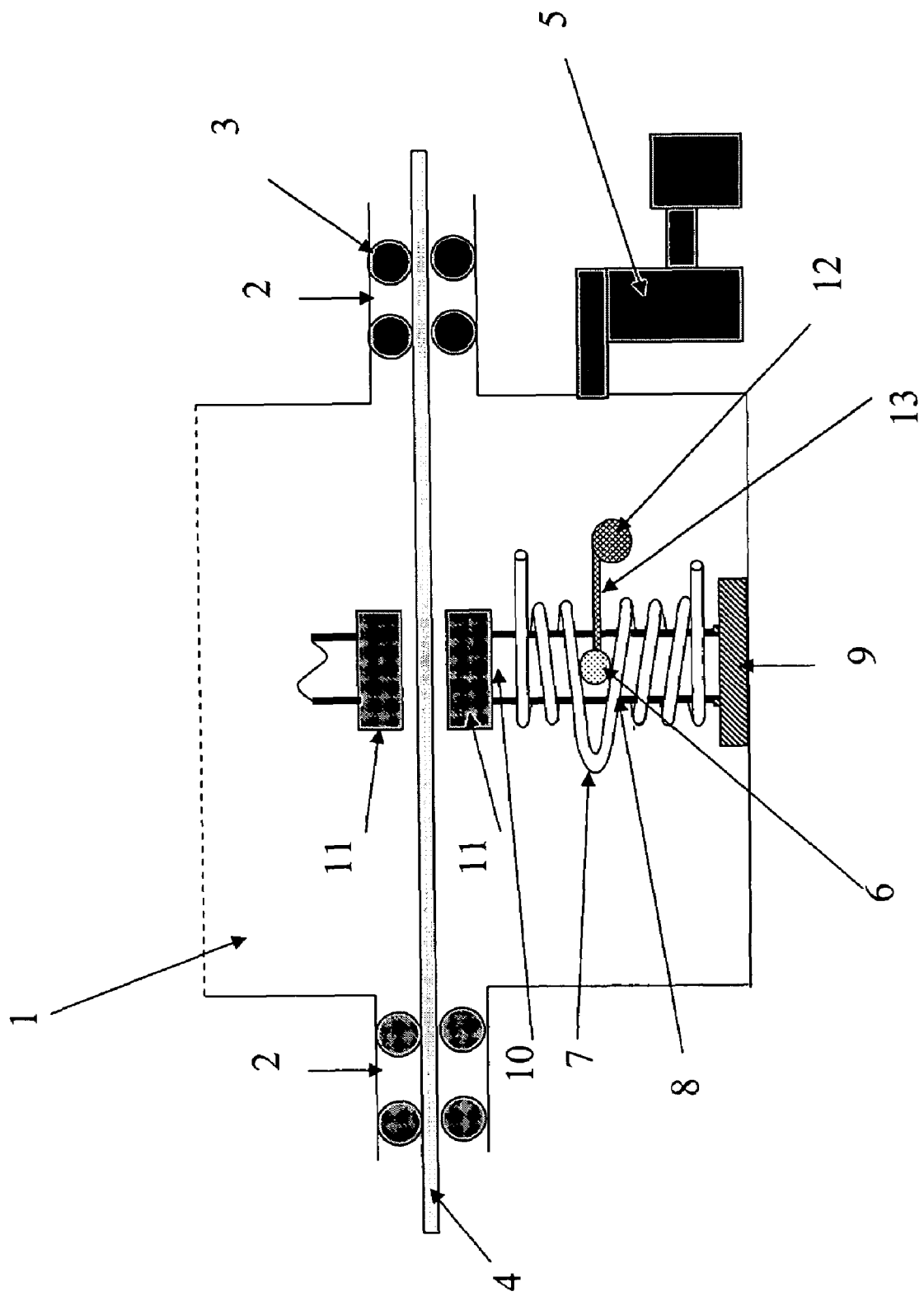

METHOD AND DEVICE FOR COATING A SUBSTRATE

CROSS-REFERENCE TO RELATED APPLICATIONS

This application is a continuation-in-part of International Application No. PCT/NL03/00139, filed on 21 Feb. 2003, claiming the priority of Netherlands Patent Application No. 1020059 filed on 21 Feb. 2002, both of which are incorporated herein by reference in their entirety.

FIELD OF THE INVENTION

The invention relates to a method for coating a substrate with a layer of a material, such as a metal, in which a quantity of electrically conductive material is vaporized in a space with a low background pressure and energy is supplied to the material which is to be vaporized in order to vaporize this material. The invention also relates to a device for coating a substrate, and to a substrate obtained using the method or device.

BACKGROUND OF THE INVENTION

The method described above is a known technique for coating substrate with (thin) layers of coating material; the method is usually referred to as physical vapour deposition (PVD). This technique is in widespread use in the electronics and optical industries, in the glass industry and in the manufacture of metal-coated plastic sheets for all kinds of applications. PVD is an attractive coating method because the quality which can be achieved is high and there are no waste products produced.

When using PVD, the coating material firstly has to be converted to the vapour phase. This is achieved by heating the coating material in a chamber in which there is a very low background pressure, known as a vacuum chamber. As a result of the heating, the coating material changes to a vapour until a pressure which is in thermodynamic equilibrium with the hot surface of the coating material where the vapour is formed is reached. This equilibrium vapour pressure is the most important parameter for the transfer rate of the coating material to the substrate on which the vapour is deposited.

The equilibrium vapour pressure is dependent on the temperature of the coating material. To achieve a reasonable transfer rate of coating material to the substrate, i.e., a reasonable quantity of coating material which is deposited on the substrate per unit time, the coating material generally has to be heated to high temperatures. These temperatures are often of the order of half the boiling point at atmospheric pressure or sometimes even higher. In practice, the temperatures for metals are between approximately 600° C. for zinc and approximately 2200° C. for niobium and rhenium.

Metals such as tantalum, molybdenum and tungsten require such high temperatures that they are not used for PVD. Metals such as titanium, chromium, nickel, aluminium and the like are rarely used as the material transfer rates are low.

A drawback of using PVD is that the transfer rates are limited primarily by the fact that the coating materials which have to be vaporized are always in the liquid state on account of the high process temperatures. Consequently, the material has to be in a crucible, which may be made, for example, from a ceramic material or from copper. In the latter case, intensive cooling with water is required, so that a thin film of solidified coating material covers the copper, with the result that the copper is prevented from melting or being vaporized as well and the copper is not affected. One disadvantageous consequence of cooling of a copper crucible is that a significant proportion of the heat supplied is lost as a result of the cooling. The use of a ceramic crucible is limited to coating materials which do not enter into a chemical reaction with the crucible material at the high process temperatures. The supply of the thermal energy required also presents a problem when using a ceramic crucible, since most ceramic materials are poor heat conductors. JP 08-104981 to Teruyuki discloses a PVD device employing a crucible and is incorporated herein by reference in its entirety.

SUMMARY OF THE INVENTION

It is an object of the invention to provide an improved method and device for coating substrates by means of PVD.

Another object of the invention is to provide a method and device of this type in which the transfer rate of the coating material is higher than has hitherto been possible.

Yet another object of the invention is to provide a method and device of this type which in practice make it possible to use materials utilizing PVD as coating material where this has not hitherto been possible.

The invention relates to a method for coating a substrate with a layer of a material, such as a metal, in which a quantity of electrically conductive material is vaporized in a space with a low background pressure and energy is supplied to the material which is to be vaporized in order to vaporize this material. According to the invention, the material which is to be vaporized, while it is being vaporized, is kept floating, without support, in the space and is enclosed in an alternating electromagnetic field, the alternating electromagnetic field being generated with the aid of a high-frequency alternating current. The invention also relates to a device for coating a substrate and to a substrate.

BRIEF DESCRIPTION OF THE DRAWING

The sole FIGURE shows a schematic process flow chart of a device for use in the process of the present invention.

DETAILED DESCRIPTION OF THE PREFERRED EMBODIMENTS

According to a first aspect of the invention, one or more of these objects are achieved by a method for coating a substrate with a layer of a material, such as a metal, to form a coated substrate. In the method a quantity of electrically conductive material is vaporized in a chamber providing a space with a low background pressure and energy is supplied to the material which is to be vaporized in order to vaporize this material. In this method the material which is to be vaporized, while it is being vaporized, is kept floating, without support, in the space and is enclosed in an alternating electromagnetic field, and in which method the alternating electromagnetic field is generated with the aid of a high-frequency alternating current. Typically the chamber communicates with a vacuum pump to achieve the low background pressure.

Keeping the material which is to be vaporized floating without support in the space means that it is no longer necessary to use a copper or ceramic crucible. As a result, it is possible to impart a higher temperature to the material which is to be vaporized, since the crucible no longer forms the limiting factor. Therefore, the transfer rate of the vaporized material to the substrate can be increased. Since it is no longer necessary to use a crucible, it is also possible to vaporize materials which it has not hitherto been possible to use, on account of their ability to react with the material of the crucible.

It is possible to enclose an electrically conductive material in an alternating electromagnetic field as a result of Lorentz forces, which are generated by the interaction between the external magnetic field and the eddy currents which are thereby induced in the electrically conductive material.

The alternating electromagnetic field is generated with the aid of a high-frequency alternating current. A high-frequency alternating current is required so that it is possible to keep floating a sufficiently large mass of electrically conductive material for it to be possible for a quantity of electrically conductive material per minute which is sufficient for coating of the substrate on an industrial scale to be vaporized efficiently.

The process of floating and melting conducting materials in an alternating electromagnetic field is known under the name "levitation melting". A method and device for this purpose are described in EP 0751361 B1 incorporated herein by reference in its entirety; in this case, the melted material is used for precise casting. It should be noted that a water-cooled crucible, with which the molten material must not come into contact, is still always used.

U.S. Pat. No. 5,738,163 to Demukai et al. also discloses a levitation melting method and a levitation melting and casting device and is incorporated herein by reference in its entirety. U.S. Pat. No. 4,385,080 to de Rudnay discloses a method for evaporating metals and semiconductors by electromagnetic levitation and is incorporated herein by reference in its entirety.

Levitation melting in an alternating electromagnetic field is also described in a number of articles by various authors in "3rd International Symposium on Electromagnetic Processing of Materials", Apr. 3-6, 2000, Nagoya, Japan, pp 345-375, incorporated herein by reference in its entirety. Hitherto, however, levitation melting has not been used in conjunction with physical vapour deposition; levitation melting followed by vaporization according to the invention is not known.

EP 0751361 describes a levitation melting method in which material is introduced into a water cooled copper crucible provided with an induction heating coil wound therearound and melted such that molten metal is prevented from contacting any inner wall surface of the crucible. When the molten metal is delivered, some molten metal is left in the crucible and additional material is introduced over the remaining molten metal, thereby repeating the melting step.

In that levitation melting method, when additional material is added to the molten metal left in the crucible, gaps in the material are filled with the molten metal. Therefore, when the material, having an irregular configuration and low bulk density, is surrounded with the molten metal, the entire bulk density in the crucible is raised. Consequently, the additional material needs no specified cross-sectional configuration, and no process step for adjusting the configuration of the material is required. Even a material with a low bulk density and an irregular configuration can be melted efficiently.

Consequently, the number of process steps and the manufacturing cost can be significantly reduced. When the method is applied to a precision casting process, final products can be manufactured with remarkably low cost.

In the levitation melting method, the quantity of molten metal left in the crucible is preferably sufficient for filling gaps in the additional material. For this purpose, the weight and bulk density of the additional material and the quantity of a single delivery of molten metal are determined such that the condition K<1.8 is satisfied in the following equation:

$$W_S = K \cdot W_M / \{K - 1 + (\rho_M / \rho_s)\} \quad (1)$$

$W_S$: the quantity of the additional material measured in kilograms;
$W_M$: the weight of molten metal before delivery measured in kilograms;
$\rho_M$: the specific gravity of molten metal measured in g/cm$^3$;
$\rho_s$: the bulk specific gravity of the material measured in g/cm$^3$; and
K: operational parameter.

The formation of equation (1) is now explained.

First, the estimated volume of gaps in the additional material in bulk, $V_S$, is expressed in the following equation (2).

$$V_S = (W_S / \rho_s) - (W_S / \rho_M) = W_S (1/\rho_s - 1/\rho_M) \quad (2)$$

The estimated volume of the molten metal left in the crucible, $V_R$, is expressed in the following equation (3).

$$V_R = (W_M - W_S) / \rho_M \quad (3)$$

If $V_S$ largely exceeds $V_R$, the material coarsely fills in the crucible, and the induction heating efficiency is thus decreased. There is a transition point of heating efficiency around the value $V_S = 1.8 V_R$. If the value is in a range of $V_S = 1.5 V_R$ and $V_S < 1.5 V_R$, an excess drop in the heating efficiency can be avoided.

If $V_S$ is lower than $V_R$, the induction heating efficiency can be constantly maintained at a high value. However, a value of $V_S$ excessively lower than $V_R$ necessitates an excessively large facility for melting and casting. When the lower limit of $V_S$ is around 0.5 $V_R$, the facility can be a realistic size.

When the effective range of the ratio of $V_S$ relative to $V_R$ is set as K, the relationship between $V_S$ and $V_R$ is expressed in following equation (4).

$$V_S = K \cdot V_R \quad (4)$$

The equation (4) is substituted with equations (2) and (3) and arranged to form the following equations (5) thru (7).

$$W_S (1/\rho_s - 1/\rho_M) = K \cdot (W_M - W_S) / \rho M \quad (5)$$

$$W_S (1/\rho_s - 1/\rho_M + K/\rho M) = K \cdot W_M / \rho_M \quad (6)$$

$$W_S = K \cdot W_M / (K - 1 + \rho_M / \rho_s) \quad (7)$$

The resulting equation (7) is equivalent to equation (1). As aforementioned, the effective range of value K is preferably no more than 1.8 and preferably between 0.5 and 1.5. Under this condition, the size of the facility is prevented from being excessively large.

In the levitation melting method, material pieces or powder are blended to form material to be added into the crucible, the bulk specific gravity of which is determined such that the value of K is lower than 1.8 and preferably between 0.5 and 1.5 in the following equation (8).

$$\rho_S = \rho_M \cdot W_S / \{K(W_M - W_S) + W_S\} \quad (8)$$

$W_S$: the weight of the additional material measured in kilograms;
$W_M$: the weight of molten metal before delivery measured in kilograms;

$\rho_M$: the specific gravity of molten metal measured in g/cm³;

$\rho_S$: the bulk specific gravity of material measured in g/cm³; and

K: operational parameter.

The equation (8) is derived by arranging equation (7) for $\rho_S$.

For example, when precision casting is conducted using cast molds of the type used for mass production, the weight of the additional material, or $W_S$, is determined or limited by the dimension of the mold. To prepare a determined weight of the additional material, the blend rate of material pieces or powder having various configurations is predetermined so as to satisfy the requirements of equation (8).

The weight of molten metal before delivery, or $W_M$, can be varied. If the conditions satisfy the equations (1) and (8), melting steps can be repeated while the value of $W_M$ is increased or decreased to a degree. Therefore, the quantity of the additionally introduced material and the bulk specific gravity of the material can be varied as long as these values are in such a range as to satisfy the requirements of equations (1) and (8).

The levitation melting method, in which foreign material is prevented from entering the molten metal in the crucible, is especially suitable for melting titanium, chromium, molybdenum, nickel, alloys of these metals, or other high-melting point active metals. The method of EP 0751361 is appropriate for a precision casting process or a so-called near net shape casting process. In the near net shape casting process, molten metal is cast into a configuration close to that of a final product, requiring little material to be cut or finished. The method of EP 0751361 can be applied for melting metals other than those specified above, and for other casting processes, for example, to form ingots or billets. The method can provide a levitation melting method in which while, or after, an almost predetermined quantity of molten metal is delivered from the crucible, another melting step is continued, for any purpose, using any material to be melted.

The method of EP 0751361 also provides a levitation melting and casting facility composed of a water cooled copper crucible provided with an induction heating coil therearound. The bottom of the crucible is blocked with material identical to the material to be melted in the crucible. Concurrently, the inside of the crucible is shielded with inactive gas. By conducting electricity to the induction heating coil, the material in the crucible is melted. A suction tube of a cast mold is inserted through the top of the crucible into the molten metal, for a suction casting process. The crucible is provided with a material holder for receiving material to be additionally melted. After the suction casting process is completed, the material holder is positioned on the top of the crucible, replacing the cast mold, and the material is injected from the material holder into the crucible. The material is introduced from the material holder down into the crucible. Therefore, the material can be prepared so as to satisfy the conditions specified in the equations (1) and (8) and stored in the material holder, before being additionally injected into the crucible.

In the present invention frequency of the alternating current is preferably 10 kHz or higher, more preferably 50 kHz or higher, even more preferably 250 kHz or higher, yet more preferably 1 MHz or higher, and still more preferably 1.5 MHz or higher. The level of the frequency is related to the quantity of material which is to be vaporized per unit time, for example if a substrate is to be coated continuously. This requires a certain vaporizing surface area at a selected temperature of the floating material. This quantity of floating material requires a minimum eddy current in the surface layer of the floating material and therefore a minimum frequency of the alternating current.

According to a preferred embodiment, the alternating electromagnetic field is generated with the aid of an alternating current passing through a coil with a current intensity of 200 A or more, preferably with a current intensity of 500 A or more, more preferably with a current intensity of 1 kA or more, and even more preferably with a current intensity of 4 kA or more. The intensity of the alternating current must be selected as a function of the level of the frequency of the alternating current in order to obtain a sufficient heating capacity.

Preferably, the power which is dissipated in the floating material is at least 2 kW, preferably at least 5 kW, and more preferably at least 10 kW. This is desirable because the vaporization of the floating material increases as the dissipated power becomes greater.

According to an advantageous embodiment of the method, the material which is to be vaporized is heated with the aid of electromagnetic induction heating. In this way, the material which is to be vaporized can be heated to the desired high temperature.

As an alternative or in addition, the material which is to be vaporized can be heated with the aid of laser beams and/or electron bombardment and/or an inductively coupled plasma and/or resistance heating. All these methods of heating can readily by employed to heat floating material.

The material which is being vaporized is preferably topped up by the alternating electromagnetic field drawing in additional quantities of material which is to be vaporized over the course of time. The action of the alternating electromagnetic field of drawing in material makes it easy to top up the quantity of material which is to be vaporized, which decreases as a result of the vaporization, continuously or in steps.

According to an advantageous embodiment, the alternating electromagnetic field of the coil is shaped in such a manner that a separate section of the alternating field draws in the material to be vaporized. If the material which is to be vaporized is drawn in a separate section of the alternating field, the section of the alternating field where the material is being vaporized is not disturbed or is disturbed to a lesser extent.

In this case, the material which is to be drawn in preferably does not float freely in the space. It is then easy for the material which is to be drawn in to be moved to a location in the space from which it is then drawn in by the alternating electromagnetic field.

According to a further advantageous embodiment of the method, the separate section of the alternating field is obtained by means of an auxiliary coil which is separate from the coil. As a result, the operation of drawing in the material which is to be vaporized can be controlled and regulated independently of the vaporization of the material.

The above method is preferably used to vaporize titanium, magnesium, tin, zinc, chromium, nickel or aluminium or a mixture of one of these metals with one or more other materials, including these or other metals, since these are commercially important coating materials. After vaporization, some materials may react with a reactive gas, such as oxygen or nitrogen, with the result that nonconductive oxide or nitrides are formed. This reaction may take place during the vapour phase or immediately after the condensation on the substrate.

According to an advantageous embodiment, the substrate is continuously coated with a layer of material to make a coated substrate. In many cases, this will mean that the substrate is passed through the vacuum chamber in the form of a strip, and during the residence time of a section of the strip in the chamber sufficient material must be vaporized to coat that section of the strip. Hitherto, this was not possible on account of the low transfer rates; however, with the aid of the method as described above, it is possible to vaporize sufficient material sufficiently quickly and therefore to coat a substrate such as a strip on an industrial scale.

A second aspect of the invention provides a device for coating a substrate with a layer of a material, such as a metal, by vaporization of an electrically conductive material, comprising a chamber provided with means for producing a low background pressure in the chamber, typically a vacuum pump, means for receiving the material to be vaporized, and means for heating the material to be vaporized, in which device, according to the invention, the means for receiving the material to be vaporized comprise a coil which can be used to generate an alternating electromagnetic field to enable the material which is to be vaporized to float without support.

The provision of the coil makes it possible to make the material which is to be vaporized float, so there is no longer any need for a crucible, with the result that the method as described above can be carried out with the aid of this device.

The coil is preferably designed to generate the alternating electromagnetic field by means of a high-frequency alternating current. Since the coil makes use of a high-frequency alternating current, an alternating electromagnetic field is formed, in which the Lorentz forces can keep the material which is to be vaporized floating.

According to a preferred embodiment, the means for heating the material comprise an electromagnetic induction coil. Consequently, the material which is to be heated can easily be heated to a high temperature without making contact with the material which is to be heated.

With the coil in the device, it is preferably possible to generate the abovementioned high-frequency alternating currents, and preferably also the above-mentioned intensities of the alternating current.

As an alternative or in addition, the means for heating the material comprise a laser and/or an electron source. These means too can be used to heat the material which is to be vaporized, albeit to a slightly lesser extent.

There are preferably means for isolating the coil from the chamber. Isolating the coil from the vaporization space in the vacuum chamber makes it easy to separate the coil from the material which is to be vaporized and allows very good cooling of the coil without contaminating material entering the vaporization chamber and therefore also reaching the substrate. Also, the coolant cannot cause a short circuit in the chamber. As a result, it is possible to enable the coil to take up a high power and transmit this to the material which is to be vaporized. The isolating means are preferably made from ceramic material, since ceramic is resistant to high temperatures and to coolants. The isolating means comprise, for example, a ceramic tube, since this is easy to produce and to use.

The isolating means for the coil also provides the advantage that conductive material which condenses on the isolating materials as a result of eddy currents which are generated by the coil melts or is vaporized, so that it either returns to the floating material as molten material or is used as vapour to coat the substrate. The isolated coil is therefore self-cleaning. According to an advantageous embodiment, there are feed means for supplying the material which is to be vaporized in wire form, in order to top up the material which vaporizes during use. The material which is to be vaporized has to be constantly topped up on account of the fact that a section of the material is evaporated per unit time; for this purpose, the feed means must be designed in such a manner that the vacuum chamber remains under a vacuum.

Measuring equipment is preferably arranged in the chamber. This measuring equipment is used to control the process. The measuring equipment is preferably suitable, inter alia, for measuring temperature, for example by means of optical pyrometry.

The sole FIGURE in a schematic way shows an embodiment of a device of the present invention for coating a substrate in the form of a strip.

The FIGURE shows a vacuum chamber 1 with two vacuum locks 2, each having lock rolls 3, through which a strip 4 such as a metal strip can be transported. In the vacuum chamber 1 a low background pressure is present, and the vacuum locks 2 provide a lock for the vacuum chamber such that the strip 4 can be transported through the vacuum chamber while the low pressure is kept in the vacuum chamber. The low pressure in the vacuum chamber 1 is provided by using a vacuum pump 5.

In the vacuum chamber 1 receiving equipment is present for receiving material 6 to be vaporized, the receiving equipment having a coil 7 and isolating equipment in the form of a ceramic tube 8 placed on a foot 9. The material 6 to be vaporized is present in the form of for instance a molten metal, which is vaporized inside the ceramic tube to form a vapor in the vaporization chamber 10 that is formed by the ceramic tube, the foot and a vapor distribution box 11. Inside the vaporization chamber 10 the pressure is higher than in the vacuum chamber, because vaporized particles from the material 6 are formed in the vaporization chamber. By using the vapor distribution box 11 the vaporized particles are guided to the strip 4 to form a coating on the strip 4. Vapor distribution boxes are known in the art. Receiving equipment 6 with material to be vaporized and a vapor distribution box 11 can be present on both sides of the strip 4, as schematically indicated in the drawing above the strip 4.

The coil 7 is used to generate an alternating electromagnetic field, in which the material to be vaporized is kept floating. The alternating electromagnetic field is generated with the aid of a high-frequency alternating current, which also supplies enough energy to the material to be vaporized to heat and melt it, and to vaporize it. Due to the vaporization the amount of material to be vaporized is reduced, whereas to coat a strip a large amount of material has to be vaporized. To coat the strip without interruption, a wire feeder 12 is present in the vacuum chamber, from which wire feeder a solid strip 13 is drawn into the vaporization chamber 10 to supplement the material 6 to be vaporized. The magnetic field of the embodiment shown in the figure is determined by a configuration of the coil 7 with a lower and upper part, wherein the upper part is wound in the opposite direction with respect to the lower part. The magnetic field is shaped such that a separate section draws in the material to be vaporized. With the configuration according to the drawing the opposite magnetic fields of lower and upper part of the coil 7 enclose a space in which a material is kept retained and in levitation. The separate section of the alternating field is also obtainable by means of an auxiliary coil which is separate from the coil. Thus, the magnetic field can also be realized using a coil and a separate auxiliary coil rather than a coil with an upper part and a lower part.

A third aspect of the invention relates to a substrate provided with a layer of electrically conductive material, produced with the aid of the method as described above and/or the device as described above, in which the electrically conductive material is preferably a metal, more preferably titanium, magnesium, tin, zinc, chromium, nickel or aluminium or a mixture of one of these metals and one or more other materials, including these or other metals.

It is apparent that embodiments other than those specifically described above come within the spirit and scope of the present claims. Thus, the present invention is not limited by the above-provided description but only defined by the claims appended hereto.

What is claimed is:

1. Method for coating a substrate with a layer of a material in which a quantity of electrically conductive material is introduced in a vacuum chamber and energy is supplied to the electrically conductive material, which is to be vaporized, to vaporize the electrically conductive material, comprising
    keeping the electrically conductive material to be vaporized, while it is being vaporized, floating in the vacuum chamber and enclosed in an alternating electromagnetic field, the alternating electromagnetic field being generated with the aid of a high-frequency alternating current passing through a coil,
    passing the substrate in the form of a strip through the vacuum chamber and continuously covering the substrate with a layer of the material, and
    continuously replenishing the electrically conductive material that is vaporized with additional quantities of the electrically conductive material over the course of time,
    wherein the alternating electromagnetic field of the coil is shaped such that a separate section of the alternating field draws in the additional quantities of the electrically conductive materials to the floating electrically conductive material,
    wherein the material to be vaporized is heated with the aid of electromagnetic induction heating.

2. Method according to claim 1, wherein the frequency of the alternating current is 10 kHz or higher.

3. Method according to claim 1, wherein the alternating electromagnetic field is generated with the aid of an alternating current passing through a coil with a current intensity of 200 A or more.

4. Method according to claim 1, wherein the power dissipated in the floating material is at least 2 kW.

5. Method according to claim 1, wherein the material to be drawn in does not flow freely in the space.

6. Method according to claim 1, wherein the separate section of the alternating field is obtained by means of an auxiliary coil separate from the coil.

7. Method according to claim 1, wherein the material vaporized comprises at least one member selected from the group consisting of titanium, magnesium, tin, zinc, chromium, nickel and aluminium.

8. Method according to claim 1, wherein the electrically conductive material comprises a metal.

9. Method according to claim 1, wherein the electrically conductive material is a metal.

10. Method according to claim 1, wherein the coil has a lower part and an upper part, wherein the upper part is wound in the opposite direction with respect to the lower part, and the replenishing of the electrically conductive material that is vaporized with additional quantities of the electrically conductive material over the course of time comprising continuously drawing a solid strip between the upper part and lower part into a vaporization chamber to provide the additional quantities of the electrically conductive material.

11. Method according to claim 1, wherein the replenishing of the electrically conductive material that is vaporized with additional quantities of the electrically conductive material over the course of time comprises continuously drawing a solid strip into a vaporization chamber to provide the additional quantities of the electrically conductive material.

12. Method according to claim 1, replenishing the electrically conductive material that is vaporized with additional quantities of the electrically conductive material over the course of time comprising continuously drawing a solid strip into a vaporization chamber to provide the additional quantities of the electrically conductive material with a wire feeder.

* * * * *